(12) United States Patent  
Watson

(10) Patent No.: US 6,542,376 B1
(45) Date of Patent: Apr. 1, 2003

(54) HIGH DENSITY PACKAGING OF ELECTRONIC COMPONENTS

(75) Inventor: Edwin George Watson, Voorhees, NJ (US)

(73) Assignee: L-3 Communications Corporation, New York, NY (US)

(*) Notice: Subject to any disclaimer, the term of this patent is extended or adjusted under 35 U.S.C. 154(b) by 0 days.

(21) Appl. No.: 09/822,876

(22) Filed: Mar. 30, 2001

(51) Int. Cl.[7] ................................................. H05K 7/06
(52) U.S. Cl. ........................ 361/775; 361/767; 361/776; 361/784; 361/789; 361/803; 257/723; 257/777; 257/686
(58) Field of Search ................................ 361/788–790, 361/803, 767, 768, 775, 776, 784; 257/686, 723, 777; 439/493

(56) References Cited

U.S. PATENT DOCUMENTS

| 3,878,341 | A | * | 4/1975 | Balde | 307/113 |
| 5,343,075 | A | * | 8/1994 | Nishino | 257/686 |
| 5,514,907 | A | * | 5/1996 | Moshayedi | 257/685 |
| 5,592,364 | A | * | 1/1997 | Roane | 257/686 |
| 5,637,536 | A | * | 6/1997 | Val | 257/23 |
| 5,677,569 | A | * | 10/1997 | Choi et al. | 257/686 |
| 5,754,405 | A | * | 5/1998 | Derouiche | 257/686 |
| 5,764,497 | A | * | 6/1998 | Mizumo | 257/776 |
| 5,841,638 | A | | 11/1998 | Purdom et al. | 361/790 |
| 5,857,858 | A | * | 1/1999 | Gorowitz et al. | 257/686 |
| 5,969,953 | A | | 10/1999 | Purdom et al. | 361/790 |
| 6,061,245 | A | * | 5/2000 | Ingraham et al. | 361/749 |
| 6,153,929 | A | * | 11/2000 | Moden et al. | 257/685 |
| 6,410,983 | B1 | * | 6/2002 | Moriizumi et al. | 257/723 |

OTHER PUBLICATIONS

Drawing (1 sheet): Uniframe, Stakpak, Dram, 16M x 4HI by Staktek, Apr. 18, 1995.

* cited by examiner

Primary Examiner—Albert W. Paladini
Assistant Examiner—John B. Vigushin
(74) Attorney, Agent, or Firm—Woodcock Washburn LLP

(57) ABSTRACT

Disclosed is an electronics packaging system, which provides for a high density assembly of groups of similar solid state part packages. The system provides a novel method for interconnecting the signal paths, structurally assembling and supporting the parts, and removing heat generated within the components. The system approach disclosed typically starts at the level of assembling pre-packaged parts into modules, and permeates through to the printed circuit board and box levels of assembly. The system is applicable, but not limited to, solid state memory device packaging, which typically consists of many similar parts interconnected in a matrix bus type configuration. The assembly of a building block of numerous memory components allows for the modular construction of large amounts of solid state memory.

68 Claims, 5 Drawing Sheets

HIGH DENSITY PACKAGING OF ELECTRONIC COMPONENTS

FIELD OF THE INVENTION

The present invention relates generally to packaging of electronic components and, more particularly, to apparatus and methods that achieve compact packaging of a plurality of similar electronic components by combining the components to form an interconnected module.

BACKGROUND OF THE INVENTION

Large systems of many interconnected solid state devices, such as those found in solid state data recorders, require significant numbers of similar parts to be assembled and interconnected in a high density fashion. Typically, a designer attempts to assemble as many memory components, for example, on a single printed circuit board (PCB) as possible within architectural and other constraints, thus achieving increased packing density, and increased utilization of the support or overhead electronics associated with each PCB. Increasing the number of memory devices on a single PCB also affects other overhead costs, such as structural and weight overhead associated with the PCB structure and its share of the box structure.

On one extreme, populating a PCB with a single layer of devices represents a strictly two-dimensional approach, and the highest structural and support electronics overhead cost. By contrast, stacking multiple layers of devices on the same footprint improves the structural and support electronics overhead by supporting more components in basically the same space. Although the stacking approach is a departure from a strictly two-dimensional, or area, approach, it is not a true three-dimensional, or volumetric, approach, since all interconnects between components must come down to the plane of the PCB.

Many approaches are known which stack bare die or modified packaged die to increase packing density. These approaches typically require special forms of the basic device, different from what is available as a mass-produced part. From an economic and yield perspective, it is usually best to use a mass produced component as it is available from the supplier, in a standard package and in a pre-tested state. Changing packages, or handling bare die increases cost, and increases the risk of yield reduction for the components. In a rapidly changing technological environment, the newest components are typically available only in the commercially mass produced form since the market usually consumes all that the factory can initially produce, and the manufacturer is unwilling to supply the device in any other form than that which is commercially available.

Therefore, it would be advantageous to designers of systems that require high density packaging of electronic components if a true three-dimensional approach were available to package commercially available electronic components in a high density fashion.

SUMMARY OF THE INVENTION

The present invention satisfies these needs in the art by providing apparatus and methods for high density packaging of electronic components that make use of commercially packaged and pre-tested devices in a novel grouping and three dimensional interconnection method, creating a module or block of several components, aimed at maximizing usage of structural and electronics overhead. Achieving a compact block of components allows for mounting a large number of components on a given size PCB surface, thus minimizing the number of PCB's for a given piece of equipment, the overall size and weight of the equipment, and maximizing the usage of overhead functions on the PCB.

This approach also provides methods that can be used to assemble the components into modules such as those just described, and methods to assemble such modules onto PCB assemblies. The disclosed approach has the additional advantage that once an architecture is developed for a standard part, multiple suppliers can be used to supply the standard part, and future updates of the part can be substituted into the assembly.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings an embodiment that is presently preferred, it being understood, however, that the invention is not limited to the specific apparatus and methods disclosed. In the drawings.

DETAILED DESCRIPTION OF PREFERRED EMBODIMENTS

Figure 1A:
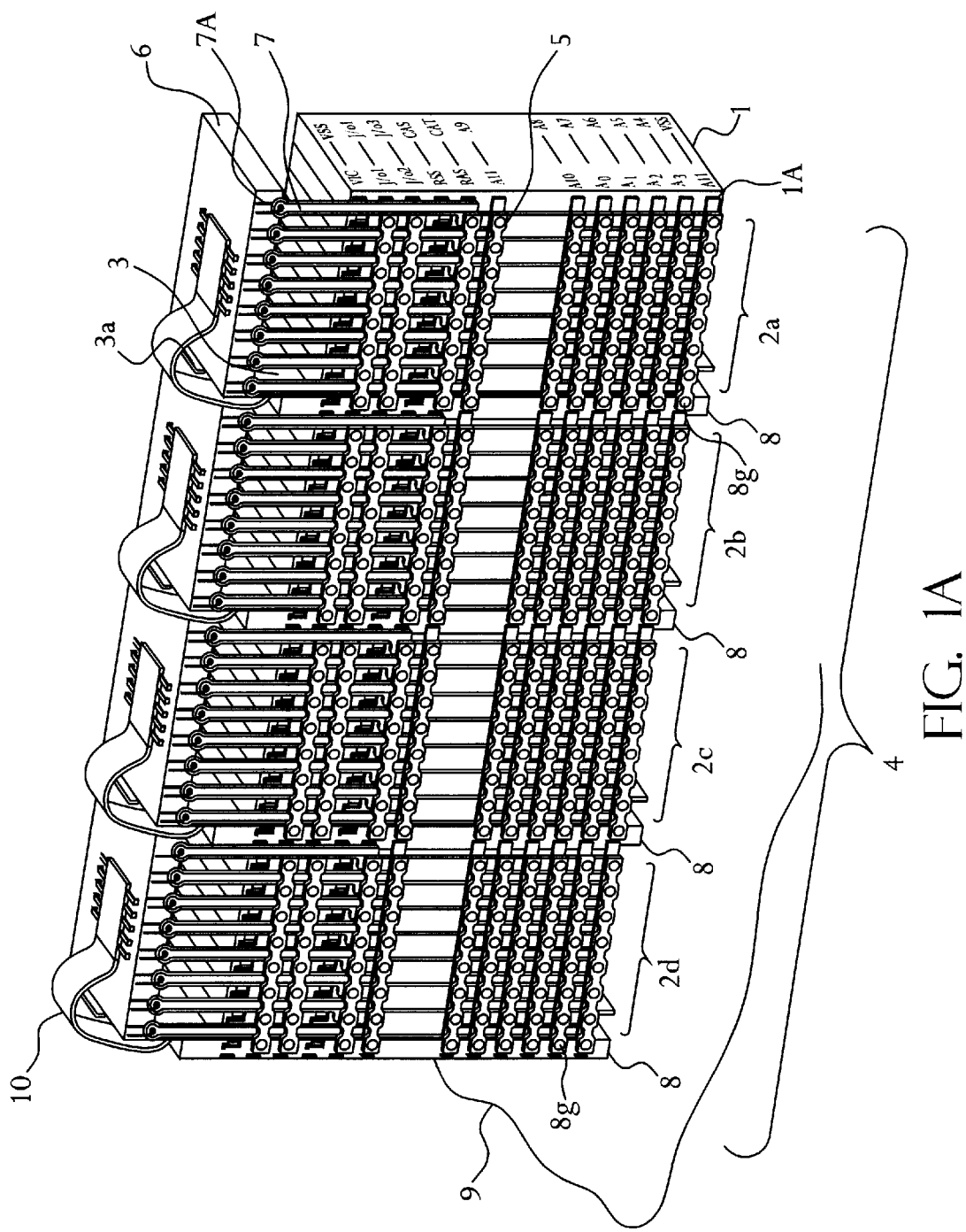
FIG. 1A depicts a preferred embodiment of the present invention as applied to a 24-pin TSOP for DRAM.

FIG. 1A depicts a preferred embodiment of the present invention wherein the inventive grouping and interconnect method is applied to a 24-pin, thin small outline package (TSOP) for dynamic random access memory (DRAM). Although DRAM chips are shown by way of example, it should be understood that the invention can be applied to many other types of electronic components, such as, for example, VRAMS, FLASH ROMs, EPROMS, SRAMS, programmable logic arrays (PLAs), microprocessors (CPUs), coprocessors, and other related integrated circuit elements.

As shown in FIG. 1A, a plurality of subgroups 2a–d are bonded together to form a group or module 4. Each subgroup 2a–d includes a plurality of commercially packaged electronic components 1, such as DRAM chips, for example.

Figure 1B:
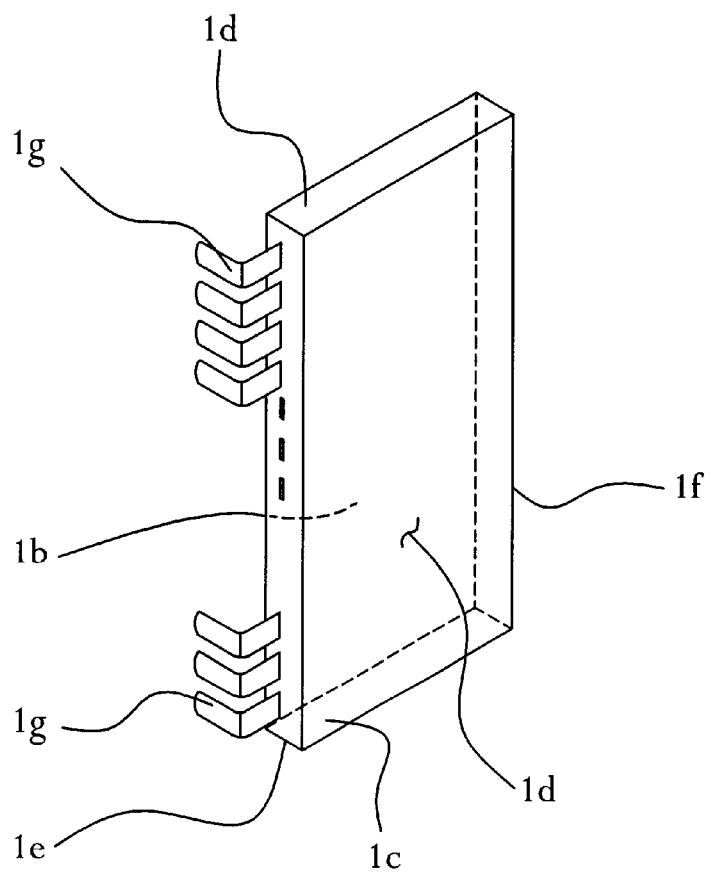
FIG. 1B depicts a typical electronic component that can be used in an interconnect system according to the present invention.

FIG. 1B depicts a typical electronic component 1 that can be used in accordance with the present invention. As shown, component 1 has a first face 1a, a second face 1b opposite first face 1a, a first end 1c extending between first face 1a and second face 1b, a second end 1d opposite first end 1c, a first side 1e extending between first face 1a and second face 1b, and a second side 1f opposite first side 1e. A set of one or more leads 1g extends from first side 1e of component 1, and a second set of one or more leads 1g extends from second side 1f of component 1.

Preferably, leads 1g are arranged as linear arrays on each side 1e, 1f of component 1, and are formed as so-called "gull wing" leads, which are typically used in surface-mount applications. Alternatively, 1g could be formed as L-shaped leads, for example, which are typically used in through-mount applications. In general, however, leads 1g can have any shape, or be formed with any desired custom feature. Gull wing leads are preferred for reasons that will be discussed in detail below. For purposes of clarity, it should be understood that, in typical prior art applications, components 1 would be mounted to a substrate, such as a printed circuit board, with second face 1b adjacent the substrate, regardless of whether the components were mounted individually, or in a stacked configuration. Thus, second face 1b is typically considered to be the "bottom" of the chip.

With reference once again to FIG. 1A, a plurality of components 1 are arranged in a stacked configuration such that the second face of each component 1 is adjacent the first face of the adjacent component. With the plurality of components 1 arranged as such, the leads on each side of the subgroup form respective lead arrays that define respective lead planes on each side of module 4. Note that the lead planes are generally parallel to the planes defined by the respective sides of the components. Significantly, and in contradistinction to known prior art devices, the interconnect system of the present invention can be mounted to one or more PCBs such that the ends of the electronic components are proximate the substrates, rather than the bottoms.

It is well known that electronic components generate heat, and that, unless excess heat is drawn away from the components, the components can overheat, and possibly malfunction as a result. In many applications, the environment in the immediate vicinity of the components is nearly as hot as the components themselves, and, therefore, the heat will not dissipate naturally from the components. In many such applications, cooling devices such as fans are used to circulate the air, but in some cases such cooling devices are undesirable due to space limitations or other design considerations.

To address the problem of component overheating, the interconnect system of the present invention preferably includes one or more thermally conductive members 3 that serve to conduct heat generated in the components 1 out of module 4 to a heat sink (not shown), which is located away from the stack. Preferably, thermal member 3 is stamped from a sheet of thermally conductive material, such as aluminum or copper, for example, and is bonded to one or more electronic components via thermally conductive epoxy. Thermal member 3 can be bonded either between two components 1 or at the end of a subgroup 2, and there can be any ratio of components 1 to thermal members 3, depending on the needs of the particular application.

Preferably, thermal member 3 is about 50 mils thick, and is about as wide as the component(s) to which it is bonded. Preferably, thermal member 3 is somewhat longer than the component(s) to which it is bonded so that heat generated by the component(s) is carried away from the stack. For example, thermal member 3 can include one or more tabs 3a that extend away from the components to the heat sink.

The heat sink can be merely a location away from the stack where the ambient temperature is lower, or it can be a physical element, such as a metalization area on a PCB, for example. Such a metalization layer can be formed, for example, by depositing layers of a metal, such as copper, for example, on the side of the PCB. Alternatively or additionally, the system can also include thermally conductive bars, made from a material such as aluminum, for example, that connect across a plurality of tabs 3a to carry excess heat away from module 4. This approach is particularly useful in an application where several modules 4 are aligned side by side on the same PCB, with the thermally conductive bars extending across two or more modules. Thus, thermal members 3 permit heat generated by electronic components 1 to be drawn away from module 4. It should be understood that thermally conductive members 3 can also provide structural support to the stack.

Preferably, the plurality of electronic components 1 are bonded together using a thermally conductive epoxy. The use of a thermally conductive epoxy to bond the components to one another is preferred because it will tend to draw heat generated by the individual components 1 through the stack to thermally conductive member 3, which, as just described, carries the heat away from the stack.

Each sub-group 2a–d also includes one or more electrically conductive interconnection members or ribbons 5. Each ribbon 5 is coupled to each of a plurality of selected component leads 1g to form a bus type interconnect between the components 1 that form the subgroup. Interconnection member 5 serves to interconnect the selected leads 1g, that is, to make all the selected leads 1g electrically the same. Preferably, the plurality of components 1 are all of the same type (e.g., all DRAMs) and, consequently, all have the same lead configuration (e.g., the leads are aligned in linear arrays on both sides of the components). Preferably, each ribbon is connected to the same respective lead for each of the components. For example, as shown in FIG. 1A, each DRAM chip has an A11 lead, and the ribbon designated by reference numeral 5 interconnects all of the A11 leads for subgroup 2a.

In general, the number of components 1 that form a subgroup 2 is variable, and interconnect member 5 can extend across as many leads 1g as desired. In practice, however, because interconnect member 5 serves as a signal bus between the components, the number of components 1g that can be interconnected by one ribbon 5 is typically limited by signal losses that increase as the length of ribbon 5 increases. Thus, the number of components that form a subgroup 2 can be based on certain design considerations such as signal losses that can be tolerated in the bus line so that the component at end of bus line gets enough voltage or does not suffer too much timing loss.

Other design considerations, such as the desired system architecture, can also influence the number of components 1 that form a subgroup 2. For example, an architecture that is favorable for fault tolerances can be chosen wherein the collection of devices can operate at a reduced level in the event of a single device failure. The ability to draw sufficient excess heat away from module 4 can also affect the number of components.

Figure 1C:
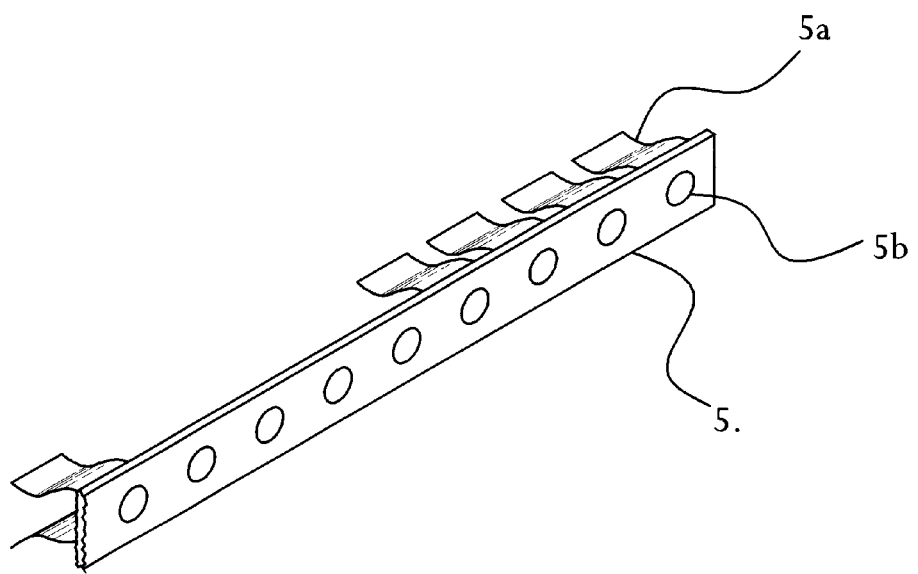
FIG. 1C depicts an interconnect ribbon that can be used in an interconnect system according to the present invention.

Preferably, interconnect member 5 is both physically and electrically connected to each of the selected leads. To accomplish this, the present invention provides a unique interconnect ribbon design that enables the manufacturer of the interconnect system to more easily build the device. As shown in FIG. 1C, an interconnect ribbon 5 according to the present invention is generally elongated, and includes a plurality of spring clips or other such ribbon connection members 5a, which are spaced along the length of ribbon 5.

Each ribbon connection member 5a is sized and shaped to clip onto one of the selected leads 1g to which ribbon 5 is to be connected. Preferably, spring clips 5a include solder application holes 5b as shown. Thus, ribbon 5 can be clipped onto the selected leads and thereby held in place temporarily until a solder drop can be deposited through each solder application hole 5b to secure ribbon 5 to leads 1g. Thus, stable physical and electrical connections can be established between ribbon 5 and each of the selected leads 1g. This design also lends itself to automated soldering techniques, such as wave soldering, for example.

According to the present invention, each sub-group 2a–2d also includes a crossover member 8, which is attached to the respective sub-group 2. Each crossover member 8 provides interconnectivity between an interconnect member 5, and one or both of a main PCB or "motherboard" 9 and a support PCB or "daughterboard" 6. In general, the PCBs 6, 9 can include multiple layers of interconnect and active electronic components. Preferably, one or both of the PCBs 6, 9 is attached to thermal members 3 for structural support of the system, and for thermal sinking.

Figure 1D:
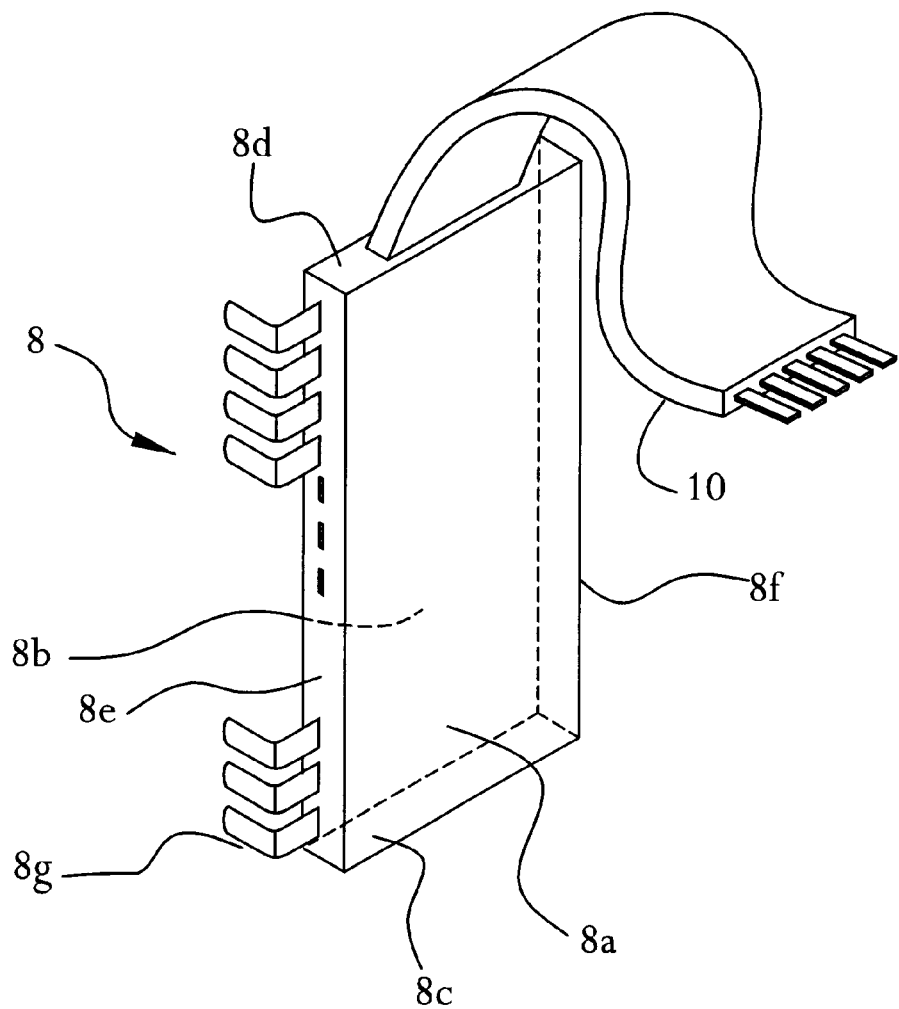
FIG. 1D depicts a cross-over device that can be used in an interconnect system according to present invention.

Basically, from an interconnection perspective, crossover member 8 mimics the electronic components that form the subgroup 2. Preferably, as shown in FIG. 1D, crossover member 8 includes a housing having an interior region formed by a first face 8a, a second face 8b opposite first face 8a, a first end 8c extending between first face 8a and second face 8b, a second end 8d opposite first end 8c, a first side 8e extending between first face 8a and second face 8b, and a second side 8f opposite first side 8e. Each side 8e, 8f of crossover member 8 includes a linear array of leads 8g, which mimics the linear array of leads 1g on each side 1e, 1f of the electronic components 1. Thus, as shown in FIG. 1A, interconnect member 5 can be electrically and physically connected to crossover member 8 in the same manner as it is connected to the selected leads 1g of the electrical components 1 that form subgroup 2.

Preferably, as shown in FIG. 1A, crossover member 8 is coupled to one or more PCBs, such as support PCB 6 or main PCB 9, for example, via a flexible interconnect ribbon 10. Within the interior region of crossover member 8, circuit paths can be arranged in any desired fashion to route signals between the interconnect members 5 and the PCB(s) (or between multiple interconnect members). Signals present on PCB 6, for example, can then drive, via crossover member 8, the bus type interconnect formed by the connections between ribbon 5 and leads 1g. Thus, components on the PCB(s) can communicate with electrical components 1. Thus, a device on support PCB 6, for example, can send a signal through interconnect member 10, through crossover member 8, through interconnect ribbon 5, to the leads designated A11 on all of the components 1 that form a particular subgroup 2.

It should be understood that, in certain applications, it is desirable to convey certain signals between one or more devices on one of the PCBs and a specified, individual lead on one of the components 1, without the signals being conveyed to all of the corresponding leads on all of the other components 1 that form the subgroup. That is, the designer will not always want signals traveling between the substrate and the subgroup to be transported via ribbon interconnect 5. Therefore, as shown in FIG. 1, support PCB 6, for example, can also interconnect with individual component leads via a conductive member 7, which attaches from support PCB 6 to a selected lead 1g of a selected component 1. The interconnect system of the present invention can include any number of conductive members 7, or none at all, depending on the requirements of the particular application.

Conductive members 7 are preferably thin and elongated, as shown, although they may be of a flex circuit design. Conductive members 7 can be stamped out of a sheet of conductive material, such as aluminum or copper, and may be covered with insulation. Each conductive member 7 is electrically connected to a device on the PCB to which the conductive member 7 is physically connected. Traces 7a interconnect conductive member 7 to devices (not shown) on PCB 6. Thus, conductive member 7 can be electrically and physically connected to only one lead, with no connections to other leads of the same component or of other components in the subgroup 2. Consequently, the interconnect system of the present invention allows for some leads to be connected bus style, while others can be addressed individually.

The addition of conductive members 7 is particularly desirable for purposes of controlling individual components. For example, a device on PCB 6 can control a specified component by conveying a control signal via conductive member 7 to the specified component, which causes the specified component to read a data signal traveling on the bus formed by ribbon interconnect 5. It should be understood that, alternatively or additionally, one or more conductive members 7 can interconnect with individual leads with main PCB 9.

Thus, in contradistinction to known prior art devices, an interconnect system according to the present invention is a true 2D to 3D converter. That is, the inventive interconnect system does not restrict signal flow to a particular plane, but rather, allows the signals to change direction. For example, the interconnect system permits a signal traveling in the plane defined by interconnect ribbon 5 to be diverted between the plane formed by support PCB 6 and the plane defined by interconnect ribbon 5. As these planes are not necessary parallel, and can even be orthogonal, the interconnect system of the present invention is a true three-dimensional system.

Figure 2:
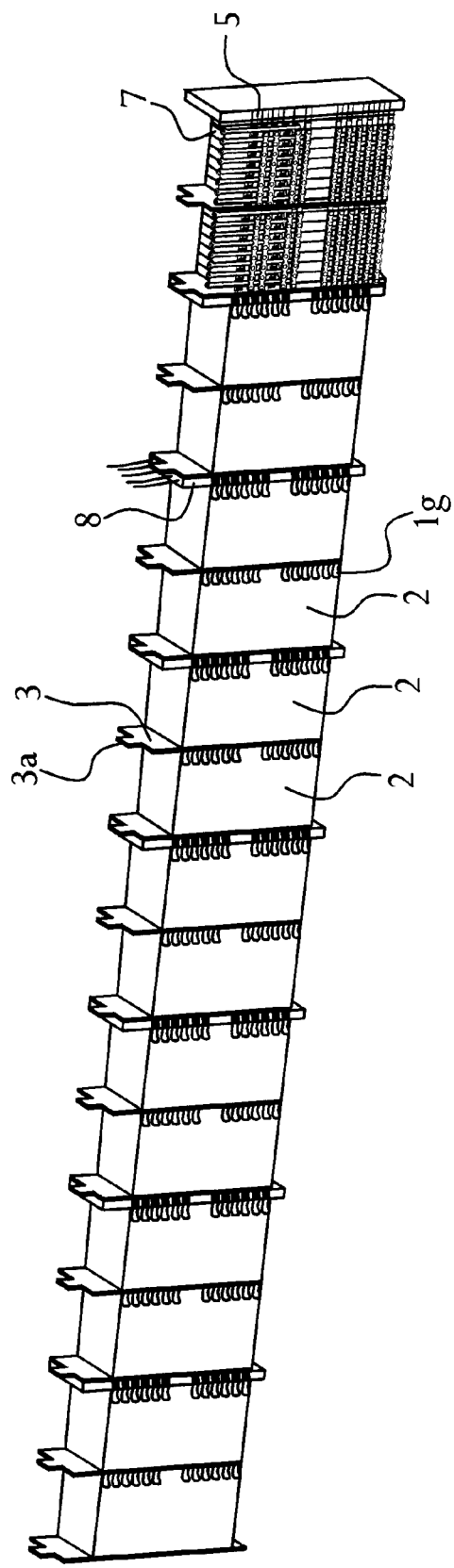
FIG. 2 depicts a preferred embodiment of the present invention in which the packaging methods have been replicated many times to package an increased number of components into a group.

A shown in FIG. 2, the above-described approach can be replicated as many times as necessary to package any desired number of components 1 into a group 4. Any number of groups 4 can be assembled on the surface of a base PCB 9 to achieve high-density packaging and maximum overhead utilization of base PCB 9, and thereby, to maximize the use of overhead electronics resident on base PCB 9. Interconnection between base PCB 9 and support PCB 6 can be accomplished by the use of flexible circuitry, as well as across multiple support PCBs.

Techniques by which the modules described above can be made include well known automated solder reflow and solder wave techniques, which can be modified as necessary to satisfy the requirements of a specific application. Also, automated techniques by which a plurality of chips can be stacked and bonded are also known.

Figure 3B:
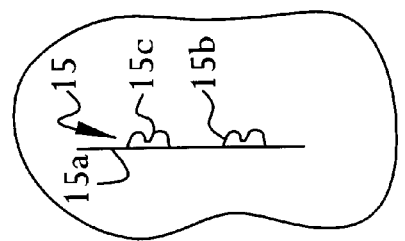
FIG. 3B depicts an interconnect ribbon that can be used in an interconnect system according to the present invention.
Figure 3A:
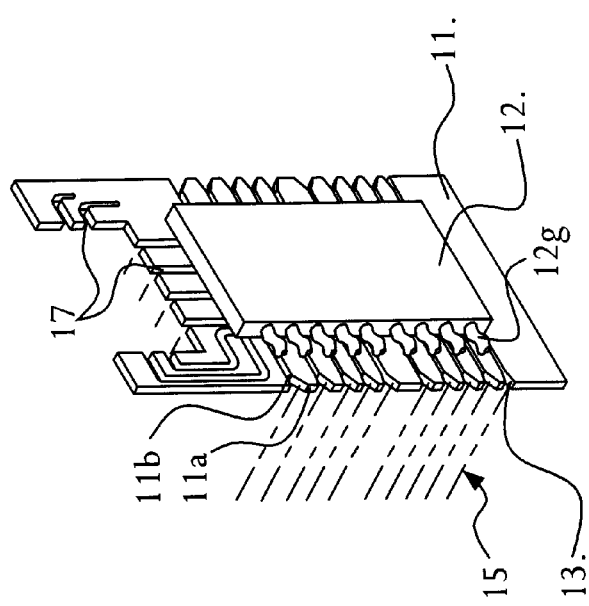
FIG. 3A depicts a preferred embodiment of the present invention in which a thin insulative material with specific conductive paths is assembled to a solid state component and electrical interconnected with the component.

FIG. 3A depicts another preferred embodiment of the present invention, which is particularly suitable for applications wherein the electronic components 1 have small lead pitches (i.e., the distance between leads). In some cases, the lead pitches can be small enough to cause practical difficulties in attaching a ribbon interconnect, such as ribbon interconnect 5 described in detail above. In such circumstances, as shown in FIG. 3, a substrate or pad 11, which can be made of a thin insulative material, for example, can be assembled to an electronic component 12, as by bonding with epoxy, for example. Pad 11 includes a conductive trace 13 that corresponds to each lead 12$g$, and to which the leads 12$g$ are soldered or otherwise electrically connected.

A plurality of pads 11 can then be electrically interconnected to form an interconnect system as described above via one or more thin, bus-type interconnects 15, such as wires, for example. A particularly preferred interconnect 15 is shown in FIG. 3B. Interconnect 15 includes a first elongated portion 15$a$, which can be a wire, for example, and a plurality of notched connection members 15$b$, having notches 15$c$ that are sized, shaped, and positioned to correspond to notches 11$a$ at interface locations 11$b$ on pad 11. Interconnect 15 can then be placed against pad 11 such that notches 15$c$ line up with notches 11$a$, and soldered to form an electrical and physical connection. Thus, interface locations 11$b$ contain features which allow interconnection with conductors acting perpendicular to the insulator plane, and serve to interconnect multiple stacked components in a similar fashion as that shown in FIG. 2. Electrical support components (not shown) can also be mounted to pad 11.

The interface features can also serve to connect individual conductor paths to specific locations on adjacent PCBs. For example, traces 17 can serve the same purpose as conductive members 7 described above for controlling individual leads of specified components.

Figure 4:
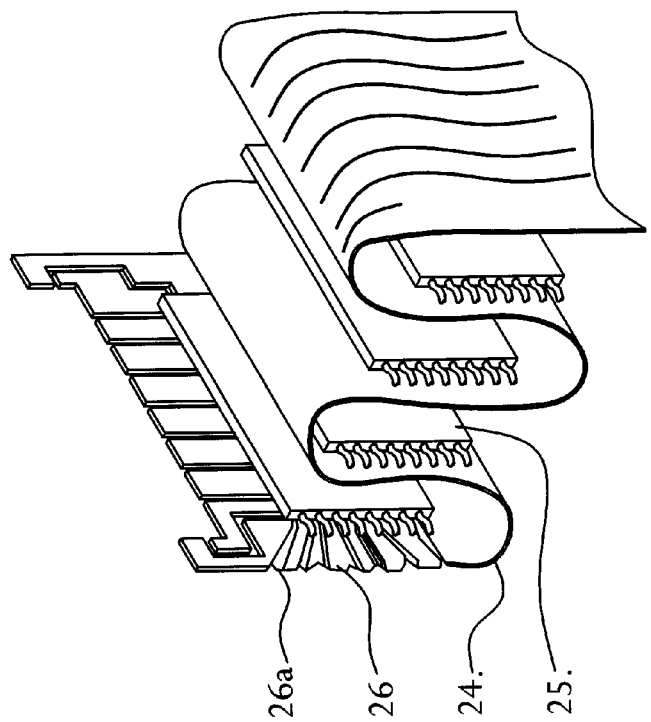
FIG. 4 depicts another preferred embodiment of the present invention which includes a thin insulative of material having specific conductive paths.

FIG. 4 depicts still another preferred embodiment of the present invention which includes a thin insulating layer of material 24 having specific conductive paths 26 (electrical and thermal). Layer 24 is elongated in one or more directions to allow multiple devices 25 to be attached and interconnected, and to allow positioning of the multiple devices into an effective stack. Electrical support components (not shown) can also be mounted to the insulating layer and connected to the conductor circuit. Conductive paths 26 can also route to selected interface locations 26$a$ on the periphery of insulating material 24.

Thus there have been described apparatus and methods for high density packaging of electronic components. Those skilled in the art will appreciate that numerous changes and modifications may be made to the preferred embodiments of the invention and that such changes and modifications may be made without departing from the spirit of the invention. It is therefore intended that the appended claims cover all such equivalent variations as fall within the true spirit and scope of the invention.

I claim:

1. A high density electronic interconnect system, comprising:
   a plurality of electronic components positioned adjacent to one another, each of the electronic components having at least one lead;
   an electrically conductive interconnect member that is electrically coupled to a respective lead from each of the electronic components; and
   a cross-over member that mimics the electronic components and is electrically coupled to the interconnect member and adapted to provide interconnectivity between the interconnect member and a printed circuit board.

2. The interconnect system of claim 1, wherein the interconnect member defines a first plane, and the cross-over device is adapted to be coupled to a printed circuit board that defines a second plane that is at a nonzero angle to the first plane.

3. The interconnect system of claim 1, wherein the cross-over member is adapted to be coupled to the printed circuit board via a flexible ribbon extending from an end of the cross-over member.

4. The interconnect system of claim 1, wherein the cross-over member has at least one lead, and the interconnect member is electrically coupled to the at least one lead.

5. The interconnect system of claim 1, wherein the plurality of electronic components are positioned adjacent to one another such that the leads define a lead plane, and
   wherein the cross-over member has a plurality of leads and is disposed relative to the plurality of electronic components such that the leads of the cross-over member are in the lead plane.

6. The interconnect system of claim 1, further comprising:
   a second electrically conductive interconnect member that is electrically coupled to a second respective lead from each of the electronic components,
   wherein the cross-over member is adapted to carry electrical signals between the interconnect members.

7. The interconnect system of claim 6, wherein the crossover member includes a housing having an interior region in which circuit paths are arranged to route signals between the interconnect members.

8. The interconnect system of claim 1, wherein at least one of the electronic components has a control lead, the interconnect system further comprising:
   an electrically conductive control member that is electrically coupled to the control lead and adapted to electrically couple the at least one electronic component to a control signal source.

9. The interconnect system of claim 1, further comprising:
   a thermally conductive member coupled to the plurality of electronic components and extending beyond an end of at least one of the electronic components.

10. The interconnect system of claim 9, wherein the thermally conductive member is stamped from a sheet of thermally conductive material, and includes a tab that extends beyond the end of the at least one electronic component.

11. The interconnect system of claim 1, wherein the electronic components are affixed to one another via a thermally conductive epoxy.

12. The interconnect system of claim 6, wherein the crossover member includes a housing having an interior region in which circuit paths are arranged to route signals between the interconnect member and the printed circuit board.

13. An interconnect ribbon for a high density electronic interconnect system, comprising:
   an electrically conductive elongated member, and
   a plurality of electrically conductive spring clips disposed along a length of the elongated member, each of said spring clips being adapted to couple the interconnect ribbon to a respective lead of an electronic component.

14. The interconnect ribbon of claim 13, further comprising a plurality of solder holes disposed along the length of the elongated member and extending therethrough via which the interconnect ribbon can be soldered to the respective lead.

15. The interconnect ribbon of claim 13, wherein at least one of the spring clips includes a solder application hole via which the interconnect ribbon can be soldered to the respective lead.

16. A high density electronic interconnect system, comprising:
- a plurality of electronic components, each of said electronic components having a plurality of leads and being mounted to a respective substrate, each said substrate having a respective trace corresponding to each said lead and extending from the corresponding lead to a respective notch at an edge of the substrate; and
- an electrically conductive interconnect member that is electrically coupled to a respective lead from each of the electronic components via the traces corresponding to the respective leads, wherein the interconnect member engages the notches to establish electrical contact with a corresponding trace.

17. The interconnect system of claim 16, wherein the interconnect member includes an elongated portion and a plurality of connection members disposed along a length of the elongated portion, each said connection member adapted to engage the edge of the substrate and establish electrical contact with the corresponding trace.

18. The interconnect system of claim 17, wherein each said connection member includes a notch that is adapted to engage a corresponding notch at the edge of the substrate.

19. A high density electronic interconnect system, comprising:
- a plurality of electronic components, each having a plurality of leads, the plurality of electronic components positioned adjacent to one another such that the leads define a lead plane;
- an electrically conductive interconnect member that is electrically coupled to a respective lead from each of the electronic components; and
- a cross-over device that is electrically coupled to the interconnect member and adapted to carry electrical signals between the interconnect member and a signaling source,
- wherein the interconnect member defines a first plane, and the cross-over device is adapted to be coupled to a substrate that defines a second plane that is at a nonzero angle to the first plane.

20. The interconnect system of claim 19, wherein the cross-over device is adapted to be coupled to the signaling source via a flexible ribbon extending from an end of the cross-over device.

21. The interconnect system of claim 19, wherein the cross-over device has at least one lead, and the interconnect member is electrically coupled to the at least one lead.

22. The interconnect system of claim 19, wherein the cross-over device has a plurality of leads, and is disposed relative to the plurality of electronic components such that the leads of the cross-over device are in the lead plane.

23. The interconnect system of claim 19, further comprising:
- a second electrically conductive interconnect member that is electrically coupled to a second respective lead from each of the electronic components,
- wherein the cross-over device is adapted to carry electrical signals between the interconnect members.

24. The interconnect system of claim 19, wherein at least one of the electronic components has a control lead, the interconnect system further comprising:
- an electrically conductive control member that is electrically coupled to the control lead and adapted to electrically couple the at least one electronic component to a control signal source.

25. The interconnect system of claim 19, further comprising:
- a thermally conductive member coupled to the plurality of electronic components and extending beyond an end of at least one of the electronic components.

26. The interconnect system of claim 25, wherein the thermally conductive member is stamped from a sheet of thermally conductive material, and includes a tab that extends beyond the end of the at least one electronic component.

27. The interconnect system of claim 19, wherein the electronic components are affixed to one another via a thermally conductive epoxy.

28. A high density electronic interconnect system, comprising:
- a plurality of electronic components, each having a plurality of leads, the plurality of electronic components positioned adjacent to one another such that the leads define a lead plane;
- an electrically conductive interconnect member that is electrically coupled to a respective lead from each of the electronic components; and
- a cross-over device that is electrically coupled to the interconnect member and adapted to carry electrical signals between the interconnect member and a signaling source,
- wherein the cross-over device has a plurality of leads, and is disposed relative to the plurality of electronic components such that the leads of the cross-over device are in the lead plane.

29. The interconnect system of claim 28, wherein the cross-over device is adapted to be coupled to the signaling source via a flexible ribbon extending from an end of the cross-over device.

30. The interconnect system of claim 28, wherein the cross-over device has at least one lead, and the interconnect member is electrically coupled to the at least one lead.

31. The interconnect system of claim 28, further comprising:
- a second electrically conductive interconnect member that is electrically coupled to a second respective lead from each of the electronic components,
- wherein the cross-over device is adapted to carry electrical signals between the interconnect members.

32. The interconnect system of claim 28, where in at least one of the electronic components has a control lead, the interconnect system further comprising:
- an electrically conductive control member that is electrically coupled to the control lead and adapted to electrically couple the at least one electronic component to a control signal source.

33. The interconnect system of claim 28, further comprising:
- a thermally conductive member coupled to the plurality of electronic components and extending beyond an end of at least one of the electronic components.

34. The interconnect system of claim 33, wherein the thermally conductive member is stamped from a sheet of thermally conductive material, and includes a tab that extends beyond the end of the at least one electronic component.

35. The interconnect system of claim 28, wherein the electronic components are affixed to one another via a thermally conductive epoxy.

36. A high density electronic interconnect system, comprising:
- a plurality of electronic components, each having a plurality of leads, the plurality of electronic components positioned adjacent to one another such that the leads define a lead plane;

an electrically conductive interconnect member that is electrically coupled to a respective lead from each of the electronic components;

a cross-over device that is electrically coupled to the interconnect member and adapted to carry electrical signals between the interconnect member and a signaling source; and a thermally conductive member coupled to the plurality of electronic components and extending beyond an end of at least one of the electronic components.

37. The interconnect system of claim 36, wherein the cross-over device is adapted to be coupled to the signaling source via a flexible ribbon extending from an end of the cross-over device.

38. The interconnect system of claim 36, wherein the cross-over device has at least one lead, and the interconnect member is electrically coupled to the at least one lead.

39. The interconnect system of claim 36, further comprising:

a second electrically conductive interconnect member that is electrically coupled to a second respective lead from each of the electronic components, wherein the cross-over device is adapted to carry electrical signals between the interconnect members.

40. The interconnect system of claim 36, wherein at least one of the electronic components has a control lead, the interconnect system further comprising:

an electrically conductive control member that is electrically coupled to the control lead and adapted to electrically couple the at least one electronic component to a control signal source.

41. The interconnect system of claim 36, wherein the thermally conductive member is stamped from a sheet of thermally conductive material, and includes a tab that extends beyond the end of the at least on electronic component.

42. The interconnect system of claim 36, wherein the electronic components are affixed to one another via a thermally conductive epoxy.

43. A high density electronic interconnect system, comprising:

a plurality of electronic components, each having a plurality of leads, the plurality of electronic components positioned adjacent to one another such that the leads define a lead plane and affixed to one another via a thermally conductive epoxy;

an electrically conductive interconnect member that is electrically coupled to a respective lead from each of the electronic components; and a cross-over device that is electrically coupled to the interconnect member and adapted to carry electrical signals between the interconnect member and a signaling source.

44. The interconnect system of claim 43, wherein the cross-over device is adapted to be coupled to the signaling source via a flexible ribbon extending from an end of the cross-over device.

45. The interconnect system of claim 43, wherein the cross-over device has at least one lead, and the interconnect member is electrically coupled to the at least one lead.

46. The interconnect system of claim 43, further comprising:

a second electrically conductive interconnect member that is electrically coupled to a second respective lead from each of the electronic components, wherein the cross-over device is adapted to carry electrical signals between the interconnect members.

47. The interconnect system of claim 43, wherein at least one of the electronic components has a control lead, the interconnect system further comprising:

an electrically conductive control member that is electrically coupled to the control lead and adapted to electrically couple the at least one electronic component to a control signal source.

48. A high density electronic interconnect system, comprising:

a plurality of electronic components, each of said electronic components having a plurality of leads and being mounted to a respective substrate, each said substrate having a respective trace corresponding to each said lead and extending from the corresponding lead to an edge of the substrate; and an electrically conductive interconnect member that is electrically coupled to a respective lead from each of the electronic components via the traces corresponding to the respective leads, wherein the interconnect member includes an elongated portion and a plurality of connection members disposed along a length of the elongated portion, each said connection member adapted to engage the edge of the substrate and establish electrical contact with a corresponding trace.

49. The interconnect system of claim 48, wherein the traces extend to notches at the edge of the substrate.

50. The interconnect system of claim 48, wherein the traces extend to notches at the edge of the substrate, and each said connection member includes a notch that is adapted to engage a corresponding notch at the edge of the substrate.

51. The interconnect system of claim 48, wherein the substrates are portions of a flexible ribbon and the interconnect member is an electrically conductive trace disposed on the flexible ribbon.

52. A high density electronic interconnect system, comprising:

a plurality of electronic components, each of said electronic components having a plurality of leads and being mounted to a respective portion of a flexible ribbon, each said portion having a respective trace corresponding to each said lead and extending from the corresponding lead to an edge of the portion; and an electrically conductive trace that is electrically coupled to a respective lead from each of the electronic components via the traces corresponding to the respective leads.

53. The interconnect system of claim 52, wherein the traces extend to notches at the edge of the substrate.

54. The interconnect system of claim 53, wherein each said connection member includes a notch that is adapted to engage a corresponding notch at the edge of the substrate.

55. A method for manufacturing a high density electronic interconnect system, the method comprising:

bonding together a plurality of electronic components, each said electronic component having at least one lead;

electrically coupling an electrically conductive interconnect member to a respective lead from each of the electronic components; and electrically coupling to the interconnect member a cross-over member that mimics the electronic components and is adapted to provide interconnectivity between the interconnect member and a printed circuit board.

56. The method of claim 55, further comprising:
coupling the interconnect member to the electronic components and the cross-over member such that the interconnect member defines a first plane, and the cross-over member can be coupled to a printed circuit board that defines a second plane that is at a nonzero angle to the first plane.

57. The method of claim 55, further comprising:
coupling the interconnect member to a cross-over member that is adapted to carry electrical signals between the interconnect member and the printed circuit board via a flexible ribbon extending from an end of the cross-over member.

58. The method of claim 55, wherein coupling the interconnect member to the cross-over member comprises electrically coupling the interconnect member to a lead of the cross-over member.

59. The method of claim 55, further comprising:
electrically coupling a second electrically conductive interconnect member to the cross-over member and to a second respective lead from each of the electronic components, such that the cross-over member can carry electrical signals between the interconnect members.

60. The method of claim 55, further comprising:
electrically coupling an electrically conductive control member to a control lead of at least one of the electronic components, the control member being adapted to electrically couple the at least one electronic component to a control signal source.

61. The method of claim 55, further comprising:
coupling a thermally conductive member to a least one of the electronic components such that the thermally conductive member extends beyond an end of the at least one electronic component.

62. The method of claim 55, wherein bonding together the plurality of electronic components comprises affixing the electronic components to one another via a thermally conductive epoxy.

63. The method of clam 55, wherein coupling the electrically conductive interconnect member to the respective leads comprises soldering the interconnect member to the respective leads.

64. A method for manufacturing a high density electronic interconnect system, the method comprising:
bonding together a plurality of electronic components, each said electronic component having a plurality of leads, such that the plurality of electronic components are positioned adjacent to one another and the leads define a lead plane;
electrically coupling an electrically conductive interconnect member to a respective lead from each of the electronic components; and
electrically coupling to the interconnect member a cross-over device that is adapted to carry electrical signals between the interconnect member and a signaling source, such that the interconnect member defines a first plane, and the cross-over device can be coupled to a substrate that defines a second plane that is at a nonzero angle to the first plane.

65. A method for manufacturing a high density electronic interconnect system, the method comprising:
bonding together a plurality of electronic components, each said electronic component having a plurality of leads, such that the plurality of electronic components are positioned adjacent to one another and the leads define a lead plane;
electrically coupling an electrically conductive interconnect member to a respective lead from each of the electronic components; and
electrically coupling to the interconnect member a cross-over device that is adapted to carry electrical signals between the interconnect member and a signaling source via a flexible ribbon extending from an end of the cross-over device.

66. A method for manufacturing a high density electronic interconnect system, the method comprising:
bonding together a plurality of electronic components, each said electronic component having a plurality of leads, such that the plurality of electronic components are positioned adjacent to one another and the leads define a lead plane;
electrically coupling an electrically conductive interconnect member to a respective lead from each of the electronic components; and
electrically coupling to the interconnect member a lead of a cross-over device that is adapted to carry electrical signals between the interconnect member and a signaling source.

67. A method for manufacturing a high density electronic interconnect system, the method comprising:
bonding together a plurality of electronic components, each said electronic component having a plurality of leads, such that the plurality of electronic components are positioned adjacent to one another and the leads define a lead plane;
electrically coupling an electrically conductive interconnect member to a respective lead from each of the electronic components;
electrically coupling to the interconnect member a cross-over device that is adapted to carry electrical signals between the interconnect member and a signaling source; and
coupling a thermally conductive member to a least one of the electronic components such that the thermally conductive member extends beyond an end of the at least one electronic component.

68. A method for manufacturing a high density electronic interconnect system, the method comprising:
affixing a plurality of electronic components to one another via a thermally conductive epoxy, each said electronic component having a plurality of leads, such that the plurality of electronic components are positioned adjacent to one another and the leads define a lead plane;
electrically coupling an electrically conductive interconnect member to a respective lead from each of the electronic components; and
electrically coupling to the interconnect member a cross-over device that is adapted to carry electrical signals between the interconnect member and a signaling source, wherein bonding together the plurality of electronic components comprises.

* * * * *

UNITED STATES PATENT AND TRADEMARK OFFICE
CERTIFICATE OF CORRECTION

PATENT NO.     : 6,542,376 B1
DATED          : April 1, 2003
INVENTOR(S)    : Edwin George Watson It is certified that error appears in the above-identified patent and that said Letters Patent is hereby corrected as shown below:

<u>Column 2,</u>
Line 48, after "insulative" please insert -- layer -- therefor.

Signed and Sealed this

Fifteenth Day of July, 2003

JAMES E. ROGAN
*Director of the United States Patent and Trademark Office*